(12) United States Patent
Seaford et al.

(10) Patent No.: US 7,704,824 B2
(45) Date of Patent: Apr. 27, 2010

(54) SEMICONDUCTOR LAYER

(75) Inventors: Matthew L. Seaford, Oak Ridge, NC (US); Arthur E. Geiss, Greensboro, NC (US); Wayne Lewis, Greensboro, NC (US); Larry W. Kapitan, Hampton, NJ (US); Thomas J. Rogers, Jamestown, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 726 days.

(21) Appl. No.: 10/842,767

(22) Filed: May 11, 2004

(65) Prior Publication Data

US 2004/0209434 A1  Oct. 21, 2004

Related U.S. Application Data

(62) Division of application No. 10/135,225, filed on Apr. 30, 2002, now Pat. No. 6,750,482.

(51) Int. Cl.
*H01L 21/8249* (2006.01)

(52) U.S. Cl. .................. 438/235; 438/309; 438/312; 257/47; 257/511; 257/517; 257/560

(58) Field of Classification Search .............. 117/954, 117/108, 103; 438/478, 481, 488, 235, 309, 438/312; 257/47, 511, 517, 518, 525, 526, 257/552–562, 565–593
See application file for complete search history.

(56) References Cited

U.S. PATENT DOCUMENTS

| | | | |
|---|---|---|---|
| 3,573,114 A | 3/1971 | Marinace | 148/189 |
| 3,615,932 A | 10/1971 | Makimoto et al. | 148/175 |
| 3,632,431 A | 1/1972 | Andre et al. | 117/201 |
| 3,793,093 A | 2/1974 | Nishizawa et al. | 148/186 |
| 3,834,953 A | 9/1974 | Nakamura et al. | 148/186 |
| 3,879,230 A | 4/1975 | Nakamura et al. | 148/1.5 |
| 4,079,504 A | 3/1978 | Kosa | 29/571 |
| 4,263,067 A | 4/1981 | Takahashi et al. | 148/190 |
| 4,560,582 A | 12/1985 | Ichikawa | 427/88 |
| 4,778,772 A | 10/1988 | Takahashi et al. | 437/31 |
| 4,904,618 A | 2/1990 | Neumark | 437/150 |
| 4,939,103 A | 7/1990 | Szolgyemy | 437/151 |

(Continued)

FOREIGN PATENT DOCUMENTS

JP   58-53827   3/1983

OTHER PUBLICATIONS

Schubert, E. Fred, "Doping in III-V Semiconductors," Cabridge University Press, Great Britain, 1993, ISBN 0 521 41919 0, Section 7.5 pp. 290-305, Section 8.4 pp. 325-337.

*Primary Examiner*—Zandra Smith
*Assistant Examiner*—Telly D Green
(74) *Attorney, Agent, or Firm*—Withrow & Terranova, P.L.L.C.

(57) ABSTRACT

The present invention provides a highly doped semiconductor layer. More specifically, the present invention provides a semiconductor layer that includes at least two impurities. Each impurity is introduced at a level below its respective degradation concentration. In this manner, the two or more impurities provide an additive conductivity to the semiconductor layer at a level above the conductivity possible with any one of the impurities alone, due to the detrimental effects that would be created by increasing the concentration of any one impurity beyond its degradation concentration.

26 Claims, 1 Drawing Sheet

U.S. PATENT DOCUMENTS

| | | | |
|---|---|---|---|
| 5,814,541 A | 9/1998 | Shibata | 438/232 |
| 5,892,781 A | 4/1999 | Pan et al. | 372/6 |
| 5,936,762 A | 8/1999 | Samson et al. | 359/341 |
| 6,750,482 B2 * | 6/2004 | Seaford et al. | 257/191 |
| 2002/0149030 A1 * | 10/2002 | Kean et al. | 257/191 |
| 2003/0155584 A1 * | 8/2003 | Barber et al. | 257/200 |

* cited by examiner

SEMICONDUCTOR LAYER

This application is a Divisional of U.S. application Ser. No. 10/135,225 filed Apr. 30, 2002, currently allowed, the disclosure of which is incorporated herein by reference in its entirety.

FIELD OF THE INVENTION

The present invention relates generally to the field of semiconductors and more particularly to a highly conductive semiconductor layer having two or more impurities.

BACKGROUND OF THE INVENTION

Semiconductors, either single element or compound (e.g., III-V) semiconductors, are widely used in integrated circuits. For example, Gallium Arsenide (GaAs) semiconductors are widely used in low-noise, high-gain, weak-signal amplifying devices. The useful properties of semiconductors depend not only on the particular semiconductor that forms the crystal, but also on the dopants that are incorporated into the crystal lattice.

Semiconductor devices require the use of highly conductive layers. The use of impurities or dopants contributes to the hole and electron charge carriers that are responsible for the electronic properties of the crystals. When excess electrons are generated, the impurity is considered a "donor" or "n-type" dopant. When excess holes are generated, the impurity is considered an "acceptor" or "p-type" dopant.

More specifically, depending on the valence of the impurity and the lattice site, the conductivity of a semiconductor layer depends upon (i) the number of electrons (or holes); (ii) the electron (or hole) mobility; and (iii) the charge of the electron. Thus, there is a direct correlation between the level of impurity and the conductivity of the semiconductor layer. Thus, in order to create a highly conductive layer, the density of the impurity must also be very high.

Importantly, however, when any single impurity is added in very high concentrations in an attempt to maximize conductivity, degradation problems occur. Such problems depend on the particular dopant used, and include but are not limited to auto compensation, diffusion, strain, and other defects. For example, when a Beryllium (Be) dopant is used above a particular concentration, diffusion may occur that degrades device performance. As another example, excessive use of a Carbon (C) dopant likely causes auto-compensation that degrades device performance. Throughout this specification, the term "degradation concentration" is used to describe the concentration at which a particular impurity begins to create detrimental effects or degrade semiconductor performance. In other words, each impurity currently used to create conducting layers has some maximum acceptable concentration before the layer is degraded in some manner. See, for example, *Doping in Semiconductors*, E. F. Schubert, University Press, 1993, herein incorporated by reference.

To date, attempts to reach beyond the accepted degradation concentration for particular dopants have focused on manufacturing techniques to reduce the detrimental effects. For example, attempts to overcome the degradation concentration for Be have focused on reducing the layer temperature during manufacture. As another example, to reduce auto-compensation, strict control is maintained on the ratio of the semiconductor elements. Such techniques often add to the manufacturing time and costs, while providing only marginal gains in the conductivity of the semiconductor layer. Furthermore, such techniques focus on minimizing rather than avoiding or eliminating the potential detrimental effects.

There is a need in the art for a highly conductive semiconductor without the aforementioned degradation problems.

SUMMARY OF THE INVENTION

The present invention provides a novel approach to the creation of a highly conductive semiconductor layer. As noted above, prior attempts to create highly conductive layers have focused on minimizing rather than eliminating the potential detrimental effects. The present invention eliminates the detrimental effects of particular impurities by avoiding the use of individual impurities at densities beyond their respective degradation concentrations. The present invention combines two or more dopants, each at a level below the dopant's degradation concentration, to provide a highly conductive layer.

More specifically, the present invention provides a semiconductor layer that includes at least two impurities. Each impurity is introduced at a level below its respective degradation concentration. In this manner, the two or more impurities provide an additive conductivity to the semiconductor layer at a level above the conductivity possible with any one of the impurities alone, due to the detrimental effects that would be created by increasing the concentration of any one impurity beyond its degradation concentration.

An additional aspect of the present invention is a semiconductor layer having two or more epitaxially grown impurities of the same carrier type. Preferably, the two or more impurities each has a smaller covalent radius than the layer atoms. More preferably, the two or more impurities are grown at substantially equivalent concentrations. The present invention also provides a method for creating a semiconductor layer having two or more impurities introduced during layer formation.

These and other aspects of the present invention as disclosed herein will become apparent to those skilled in the art after a reading of the following description of the preferred embodiments when considered with the drawings. The drawings are for the purpose of describing a preferred embodiment of the invention and are not intended to limit the present invention.

BRIEF DESCRIPTION OF THE DRAWINGS

The accompanying drawing figure incorporated in and forming a part of this specification illustrates several aspects of the invention, and together with the description serves to explain the principles of the invention.

DETAILED DESCRIPTION OF THE PREFERRED EMBODIMENT

Figure 1:
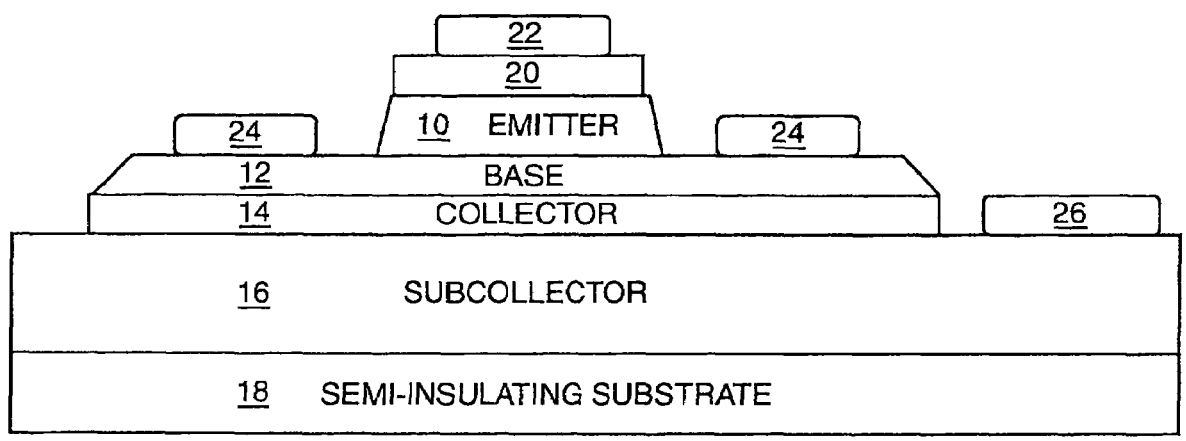
FIG. 1 is a cross-sectional view of typical layers in a heterojunction bipolar transistor.

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

FIG. 1 illustrates a cross-sectional view of an NPN-type heterojunction bipolar transistor ("HBT"). As illustrated, the HBT generally includes an emitter layer 10, base layer 12, and collector layer 14. As those skilled in the art will appreciate, the HBT will also include a subcollector layer 16 underneath the collector layer 14 and a semi-insulating substrate layer 18 underneath the subcollector layer 16. Further, to facilitate contact with the emitter layer 10, base layer 12, and collector layer 14, an emitter contact layer 20 topped with emitter metal 22 is provided to facilitate electrical contact with the emitter layer 10. Base metal 24 on top of base layer 12 facilitates electrical contact to the base layer 12 at multiple locations. Similarly, collector metal 26 is provided on subcollector layer 16 to facilitate electrical contact to the collector layer 14 and subcollector layer 16 at multiple locations.

As discussed above, an NPN-type HBT requires a highly conductive p-type base layer 12. Generally, the conductivity of a semiconductor layer is proportional to doping. The present invention provides a highly conductive, heavily doped, epitaxial layer. The present invention dopes a semiconductor layer by introducing two or more impurities during the layer formation. Thus, as opposed to manufacturing techniques that diffuse or implant a dopant after formation of the layer, the present invention introduces at least two dopants during layer formation. Although any acceptable layer-formation technique should be considered within the scope of the present invention, the most preferred technique is molecular beam epitaxy, as is known in the art.

The present invention includes the introduction of two or more dopants, such as both Beryllium (Be) and Carbon (C), to a semiconductor layer, such as a Gallium Arsenide (Gas) or other III-IV compound semiconductor layer. Heretofore, Be could be used at densities up to approximately $1.5 \times 10^{19}$ cm$^{-3}$ before diffusion of the Be atoms degrades device performance. Thus, Be has a degradation concentration of approximately $1.5 \times 10^{19}$ cm$^{-3}$. Likewise, C may be used at densities of approximately $1.5 \times 10^{19}$ cm$^{-3}$ before auto compensation degrades device performance. Thus, C has a degradation concentration of approximately $1.5 \times 10^{19}$ cm$^{-3}$ as well. Importantly, although Be and C have similar degradation concentrations, each dopant has a particular degradation concentration based upon the individual characteristics of the dopant. As noted above, reference is made to *Doping in Semiconductors*, E. F. Schubert, University Press, 1993, herein incorporated by reference, for a relatively comprehensive collection of dopants and respective degradation concentrations. The scope of the present invention is intended to cover all dopants, each having a particular degradation concentration.

Although the present invention is believed applicable to any highly doped layer, preferably, the two or more impurities are the same carrier type. Thus, preferably, the present invention provides two acceptor dopants, occupying both cation and anion sites of the crystal lattice. Additionally, the covalent radii of the impurities need not offset one another. In other words, each impurity used in the present invention may have a smaller covalent radius to the layer atoms, such as, for example both Be and C having smaller covalent radii than the Ga and As covalent radii.

As noted above, a preferred method for forming a layer of the present invention is through molecular beam epitaxy ("MBE"). As is known in the art, MBE is a deposition technique performed in ultra high vacuum to grow compound semiconductors. In MBE, atoms of an element or compound are delivered to a substrate through an ultra-pure, ultra-high vacuum ("UHV") atmosphere. The UHV atmosphere provided by the MBE chamber minimizes impurities and allows the atoms to arrive on the substrate without colliding with other atoms or molecules, thereby minimizing contaminants. The heated substrate surface allows the arriving atoms to distribute themselves evenly across the surface to form the crystal structure.

In MBE, the substrate is placed in an UHV chamber with direct line of sight to several elemental species, each of which is in an evaporation furnace commonly referred to as an effusion cell. As is known, through the use of shutters and through control of the effusion cell temperatures, a variety of material composition and doping can be achieved. Notably, however, heretofore the advantages of combining two or more dopants have not been recognized. Thus, the present invention includes the introduction of dopants during the growth of the crystal layer structure.

For example, as noted above, Be and C have degradation concentrations of approximately $1.5 \times 10^{19}$ cm$^{-3}$. Thus, during layer formation, such as during MBE, approximately $1.5 \times 10^{19}$ cm$^{-3}$ of Be and approximately $1.5 \times 10^{19}$ cm$^{-3}$ of C are introduced as impurities to the crystal structure. As shown in the table below, the combination of Be and C as dopants provides a resulting layer having properties that at least reaches, but often exceeds, the beneficial properties available with either dopant alone.

| Doping Level (cm$^{-3}$) | Dopant | Thickness (Å) | Resistance (Ω) | B (1 mA) |
| --- | --- | --- | --- | --- |
| $3 \times 10^{19}$ | Be | 800 | 324 | 197 |
| $3 \times 10^{19}$ | C | 800 | 320 | 77 |
| $3 \times 10^{19}$ | ½ C and ½ Be | 800 | 327 | 153 |

As noted above, the doping levels for the structures including Be only and C only far exceed the degradation concentration for each individual dopant. Thus, although the Be only structure appears to have the resistance and high β desired, such a structure has severe reliability problems due to Be diffusion. Notably, the C only doped structure illustrates the problem of carbon clustering, namely, a reduced β.

On the other hand, the present invention provides a more highly conductive layer than heretofore possible. As noted above, the conductivity of a semiconductor layer is the sum of the electron and hole contributions. To illustrate:

$$\sigma = ne\mu_e + pe\mu_h;$$

where n and p each represent, respectively, the concentrations of electrons and holes, e represents the charge of an electron ($1.6 \times 10^{-19}$ C), and each μ represents the mobility of the electrons (e) and holes (h), respectively. Using the present example, the intrinsic carrier concentration ($n_i$) for GaAs is $1.8 \times 10^6$ cm$^{-3}$. As is appreciated in the art, the concentrations of electrons and holes are related to the intrinsic concentration through the equation ($n^*p = n_i^2$). Therefore, only at very high doping concentrations will the majority of the layer conductivity result from the intentional dopant.

In the present example, with high p-type doping the $ne\mu_e$ portion of conductivity is approximately zero (0), and the resistivity (R) of the heavily doped p-type material can be estimated since resistivity (R) is the inverse of conductivity (σ). As is known, the number of holes in the layer p is equal to the dopant density (cm$^{-3}$) multiplied by the layer thickness. Therefore, since the present invention provides for an 800 Å layer to be doped at $3 \times 10^{19}$ cm$^{-3}$ with a mobility of 80 cm$^2$/V sec the resistivity is:

$$R = 1/\sigma$$

$$R = 1/(ne\mu_e + pe\mu_h)$$

$$R = 1/pe\mu_h$$

$$R = 1/[(3\times10^{19})*(800\times10^{-8})*(1.6\times10^{-19})*(80)]$$

$$R = 327$$

Thus, the present invention provides for superlative resistance while avoiding degradation problems associated with the individual dopants used.

Although the above example includes two dopants, the scope of the present invention encompasses any number of impurities, provided however, that no dopant is used at such a level as to degrade the semiconductor. Thus, a plurality of impurities may be added, provided that no impurity is added in a concentration substantially above the degradation concentration for the particular impurity.

Moreover, the use of two or more impurities often demonstrates synergistic effects. For example, with the structure formed with Be and C, the presence of C appears to reduce Be diffusion. Similarly, the presence of Be appears to reduce C clustering. Thus, the concentration of impurities with the present invention is greater than the sum of the individual degradation concentrations.

The highly conductive semiconductor layers of the present invention are believed useful in a variety of applications, for example, without limitation, in optoelectronics and transistors, such as HBTs, solar cells, LEDs, LASERs, and FETs. The invention is also applicable to magnetoresistors.

Although specific embodiments of the present invention have been illustrated and described in detail, it is to be expressly understood that the invention is not limited thereto. The above detailed description of the embodiment is provided for example only and should not be construed as constituting any limitation of the invention. Modifications will be obvious to those skilled in the art, and all modifications that do not depart from the spirit of the invention are intended to be included within the scope of the appended claims.

What is claimed is:

1. A method for forming a semiconductor crystal layer comprising:
   a. introducing a first impurity during formation of a crystal layer, the first impurity having a first degradation concentration; and
   b. introducing a second impurity during formation of the crystal layer, the second impurity having a second degradation concentration;
   wherein each of the first impurity and the second impurity are introduced in the crystal layer at concentrations below the respective first and second degradation concentrations, synergistically providing a resultant concentration of the first impurity and the second impurity that is greater than the sum of the first and second degradation concentrations, and the crystal layer is GaAs.

2. The method of claim 1 further comprising introducing at least a third impurity to the crystal layer.

3. The method of claim 1 wherein the first impurity is Be.

4. The method of claim 3 wherein the second impurity is C.

5. The method of claim 1 wherein the second impurity is C.

6. The method of claim 1 wherein the first and second degradation concentrations of the first impurity and the second impurity are approximately $1.5\times10^{19}$ cm$^{-3}$.

7. The method of claim 1 wherein the first and second impurities are introduced epitaxially.

8. The method of claim 7 wherein the first and second impurities are introduced by molecular beam epitaxy.

9. A method for forming a semiconductor crystal layer comprising:
   introducing a first impurity during formation of a semiconductor crystal layer, the first impurity having a first degradation concentration;
   introducing a second impurity during formation of the semiconductor crystal layer, the second impurity having a second degradation concentration; and
   introducing a third impurity, during formation of the semiconductor crystal layer, the third impurity having a third degradation concentration;
   wherein each of the first impurity, second impurity, and third impurity are introduced in the semiconductor crystal layer at concentrations below the respective first, second, and third degradation concentrations, synergistically providing resultant concentrations of the first impurity, the second impurity, and the third impurity that are greater than the sum of the first, second, and third degradation concentrations.

10. The method of claim 9 wherein the first impurity is Be.

11. The method of claim 10 wherein the second impurity is C.

12. The method of claim 9 wherein the second impurity is C.

13. The method of claim 1 wherein the first and second impurities are the same carrier type.

14. The method of claim 1 wherein each of the first and second impurities has a smaller covalent radius than layer atoms within the crystal layer.

15. A method for forming a semiconductor crystal layer comprising:
   introducing a first impurity during formation of a semiconductor crystal layer, the first impurity having a first degradation concentration; and
   introducing a second impurity during formation of the semiconductor crystal layer, the second impurity having a second degradation concentration;
   wherein each of the first impurity and the second impurity are introduced in the semiconductor crystal layer at concentrations below the respective first and second degradation concentrations, and wherein the first and second degradation concentrations are approximately $1.5\times10^{19}$ cm$^{-3}$, synergistically providing a resultant concentration of the first impurity and the second impurity that is greater than the sum of the first and second degradation concentrations.

16. The method of claim 9 wherein the semiconductor crystal layer is used in an optoelectronic device or a transistor.

17. The method of claim 9 wherein the first and second impurities have substantially equivalent concentrations.

18. A method for forming a semiconductor crystal layer comprising:
   introducing a first dopant having a concentration below a degradation concentration during formation of a semiconductor crystal layer; and
   introducing a second dopant having a concentration below the degradation concentration during formation of the semiconductor crystal layer;
   wherein the semiconductor crystal layer has a total dopant concentration of at least approximately $3\times10^{19}$ cm$^{-3}$, synergistically providing the total dopant concentration that is greater than the sum of the degradation concentration of the first dopant and the degradation concentration of the second dopant, and the semiconductor crystal layer is GaAs.

19. The method of claim 18 wherein the semiconductor crystal layer is epitaxially grown.

20. The method of claim 18 wherein the first dopant is Be.

21. The method of claim 20 wherein the second dopant is C.

22. The method of claim 18 wherein the second dopant is C.

23. A method for forming a semiconductor crystal layer comprising:
   introducing a first dopant having a concentration below a degradation concentration during formation of a semiconductor crystal layer; and
   introducing a second dopant having a concentration below the degradation concentration during formation of the semiconductor crystal layer;
   wherein the semiconductor crystal layer has a total dopant concentration of at least approximately $3 \times 10^{19}$ cm$^{-3}$, and wherein the degradation concentrations of the first and second dopants are approximately $1.5 \times 10^{19}$ cm$^{-3}$, synergistically providing the total dopant concentration that is greater than the sum of the degradation concentration of the first dopant and the degradation concentration of the second dopant.

24. A method for forming a semiconductor crystal layer comprising:
   introducing a first dopant having a concentration below a first degradation concentration during formation of a semiconductor crystal layer;
   introducing a second dopant having a concentration below a second degradation concentration during formation of the semiconductor crystal layer; and
   introducing at least one additional dopant;
   wherein the semiconductor layer has a total dopant concentration of at least approximately $3 \times 10^{19}$ cm$^{-3}$, each of the at least one additional dopant has a respective degradation concentration, and each of the at least one additional dopant is provided at a respective concentration below the respective degradation concentration for that at least one additional dopant, synergistically providing the total dopant concentration of the first dopant, the second dopant, and each of the at least one additional dopant that is greater than the sum of the first, second, and each of the at least one respective degradation concentrations.

25. The method of claim 4 wherein a second $\beta$ measurement with introducing the first and second impurity is increased over a first $\beta$ measurement with introducing only the first impurity during formation of the crystal layer.

26. The method of claim 25 wherein a second resistivity measurement with introducing the first and second impurity is increased over a first resistivity measurement with introducing only the first impurity during formation of the crystal layer.

* * * * *